(12) United States Patent
Seo et al.

(10) Patent No.: US 7,754,523 B2
(45) Date of Patent: Jul. 13, 2010

(54) METHOD FOR FABRICATING ORGANIC THIN FILM TRANSISTOR AND METHOD FOR FABRICATING LIQUID CRYSTAL DISPLAY DEVICE USING THE SAME

(75) Inventors: Hyun-Sik Seo, Gyeonggi-Do (KR); Dae-Hyun Nam, Gyeonggi-Do (KR); Nack-Bong Choi, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/148,293

(22) Filed: Jun. 9, 2005

(65) Prior Publication Data
US 2006/0046339 A1   Mar. 2, 2006

(30) Foreign Application Priority Data
Aug. 30, 2004   (KR) ............... 10-2004-0068693
Aug. 30, 2004   (KR) ............... 10-2004-0068694

(51) Int. Cl.
*H01L 21/40* (2006.01)
(52) U.S. Cl. ............... 438/99; 438/30; 438/149
(58) Field of Classification Search ........... 438/99, 438/30, 149; 257/E51.005
See application file for complete search history.

(56) References Cited

U.S. PATENT DOCUMENTS

| | | | | |
|---|---|---|---|---|
| 4,818,715 | A * | 4/1989 | Chao | 438/303 |
| 5,277,786 | A * | 1/1994 | Kawakami | 205/124 |
| 5,407,845 | A * | 4/1995 | Nasu et al. | 438/30 |
| 5,462,885 | A * | 10/1995 | Nasu et al. | 438/30 |
| 5,523,193 | A * | 6/1996 | Nelson | 430/311 |
| 6,140,164 | A * | 10/2000 | Zhang | 438/163 |
| 6,180,430 | B1 * | 1/2001 | Kong et al. | 438/30 |
| 6,204,081 | B1 * | 3/2001 | Kim et al. | 438/30 |
| 6,300,988 | B1 | 10/2001 | Ishihara et al. | |
| 6,828,582 | B1 * | 12/2004 | Ando et al. | 257/40 |
| 7,439,096 | B2 | 10/2008 | Baldwin | |
| 2003/0042562 | A1 * | 3/2003 | Giebeler et al. | 257/421 |
| 2004/0126941 | A1 * | 7/2004 | Yukawa | 438/160 |
| 2004/0251504 | A1 * | 12/2004 | Noda | 257/369 |

FOREIGN PATENT DOCUMENTS

CN   1033252 C   11/1996

(Continued)

OTHER PUBLICATIONS

Kim et al., "Enhancement of long-term stability of pentacene thin-film transistors encapsulated with transparent SnO2", Applied Surface Science, vol. 252 pp. 1332-1338 (2005).

(Continued)

*Primary Examiner*—Jarrett J Stark
(74) *Attorney, Agent, or Firm*—McKenna Long & Aldridge LLP

(57) ABSTRACT

A method for fabricating an organic thin film transistor includes forming a gate electrode on a substrate, forming a gate insulating layer on the substrate including the gate electrode, forming an organic active pattern on the gate insulating layer using a rear exposing process, and forming source and drain electrodes on the organic active pattern.

17 Claims, 11 Drawing Sheets

FOREIGN PATENT DOCUMENTS

| | | |
|---|---|---|
| CN | 1354383 A | 6/2002 |
| CN | 1372336 A | 10/2002 |
| CN | 1409417 A | 4/2003 |
| CN | 1148600 C | 5/2004 |
| DE | 10116876 | 10/2002 |
| EP | 1434282 | 6/2004 |
| EP | 1 263 062 A3 | 10/2005 |
| JP | 2002-359374 | 12/2002 |
| JP | 2003255857 | 9/2003 |
| KR | 10-0251092 B1 | 1/2000 |
| KR | 10-2000-0040113 | 7/2000 |
| KR | 10-272255 B1 | 8/2000 |
| WO | WO 99/53371 A1 | 10/1999 |
| WO | WO 01/97297 | 12/2001 |
| WO | WO 02/082560 | 10/2002 |
| WO | WO 02/091455 | 11/2002 |

OTHER PUBLICATIONS

Ando et al., "Organic Thin-Film Transistors Fabricated with Alignment Free Printing Techniquie", Materials Research Symposium Proceedings, vol. 814, pp. 283-288 (2004).

"*Self Aligned Organic Field-Effect Transistors Using Back-Surface Exposure Method*": Japanese Journal of Applied Physics; vol. 43, No. 4B, 2000; pp. 2323-2325.

\* cited by examiner

METHOD FOR FABRICATING ORGANIC THIN FILM TRANSISTOR AND METHOD FOR FABRICATING LIQUID CRYSTAL DISPLAY DEVICE USING THE SAME

The present invention claims the benefit of Korean Patent Application No. 68693/2004 filed in Korea on Aug. 30, 2004, and Korean Patent Application No. 68694/2004 filed in Korea on Aug. 30, 2004, which are hereby incorporated by reference.

BACKGROUND OF THE INVENTION

1. Field of the Invention

The present invention relates to a method for fabricating an organic thin film transistor, and more particularly, to a method for fabricating an organic thin film transistor and a method for fabricating a liquid crystal display device using the same that employ an rear exposing process to form an active layer.

2. Discussion of the Related Art

Following the development of polyacetylene, which is a conjugated organic polymer exhibiting semiconductor characteristics, an organic semiconductor has been actively studied because its advantageous characteristics of easiness in formation of a film type, flexibility, conductivity and a low production cost. An organic semiconductor may be employed in an electronic device or an optical device.

Among devices using the semiconductive polymer, an organic thin film transistor (OTFT) employing an organic material has been the focus of many ongoing researches. In general, an OTFT has a similar structure as that of an Si-TFT, and an OTFT employs an organic material at a semiconductor region, instead of Si.

An OTFT has many advantages in that a thin film can be formed by an atmospheric pressure printing process instead of plasma enhanced chemical vapor deposition (PECVD) requiring sub-atmospheric pressure for forming the existing Si thin film, a roll-to-roll process using a plastic substrate can be performed, and a low-cost transistor can be implemented.

FIGS. 1A to 1E are cross-sectional views showing a method for fabricating an organic thin film transistor (OTFT) in accordance with the related art. In FIG. 1A, a method for fabricating an OTFT according to the related art includes preparing a transparent substrate 10. In particular, a first metal material is deposited and patterned to form a gate electrode 11 using a photolithography process. The photolithography process includes a photoresist film coating process for coating a photoresist film on an etching object layer on which a pattern is to be formed, an exposing process for aligning a mask on the photoresist film and irradiating light through the mask, a developing process for forming a photoresist pattern on the etching object layer by removing the irradiated portions of the photoresist film using a developer, an etching process for forming a desired pattern by etching the etching object layer by using the photoresist pattern as a mask, and a striping process for removing the photoresist pattern remaining on the pattern. For example, the first metal material is the etching object layer, and the gate electrode 11 is patterned as the first metal material is etched.

Subsequently, SiNx or SiOx is deposited on the entire surface of the first substrate 10 including the gate electrode 11 using a plasma enhanced CVD method to form a gate insulating layer 13.

In FIG. 1B, a low-molecule organic material, such as pentacene, is deposited at an upper surface of the gate insulating layer 13 to form an active pattern 15 on a portion of the gate insulating layer 13 corresponding to the gate electrode 11. Because a photoresist film changes electric characteristics of the pentacene, a conventional photolithography process cannot be used. Thus, the active pattern 15 is formed using a shadow mask. The shadow mask has a certain region opened for allowing formation of a pattern and has a different concept from a mask used for a conventional exposing process. For example, the mask used for the conventional exposing process is divided into regions for blocking light or transmitting light, whereas the shadow mask is divided into the opened region and a closed region, so that a material for forming a pattern is deposited only through the opened region to form the same pattern as the opened region. However, a pattern formed using the shadow mask has a quite inferior precision as compared to a pattern formed by using the general mask.

As shown in FIG. 1C, a second metal material is deposited on the active layer 15 and is patterned to form source and drain electrodes 16 and 17 on the active layer 15. In particular, the second metal material is patterned using the photolithography process to form the source and drain electrodes 16 and 17 like the gate electrode 11.

In FIG. 1D, an inorganic film or an organic film is deposited at the entire surface of the substrate 10 including the source and drain electrodes 16 and 17 to form a passivation film 18. The passivation film 18 is patterned to form a contact hole 19 exposing a portion of the drain electrode 17 using the photolithography process.

Further, as shown in FIG. 1E, a transparent conductive material, such as ITO, is deposited on the entire surface of the substrate 10 including the contact hole 19, and is patterned to form a pixel electrode 20 electrically connected to the drain electrode 17 through the contact hole 19. The transparent conductive material is patterned using the photolithography process to form the contact hole 19.

However, because the method of fabricating an OTFT according to the related art requires a shadow mask to form the active pattern, the accuracy of the active pattern reduces and the number of masks uses increases. Thus, a fabrication efficiency decreases, and electrical characteristics of the OTFT are degraded.

SUMMARY OF THE INVENTION

Accordingly, the present invention is directed to a method for fabricating an organic thin film transistor and a method for fabricating a liquid crystal display device using the same that substantially obviate one or more of the problems due to limitations and disadvantages of the related art.

An object of the present invention is to provide a method for fabricating an organic thin film transistor (OTFT) that forms an accurate pattern.

Another object of the present invention is to provide a method for fabricating an OTFT that has a simplified fabrication process by omitting a shadow mask and reducing the number of masks.

Still another object of the present invention is to provide a method for fabricating an OTFT that enhances electrical characteristics of the OTFT by increasing a contact area between an active layer and source/drain electrodes of the OTFT.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for fabricating an organic thin film transistor includes forming a gate electrode on a substrate, forming a gate insulating layer on the substrate including the gate electrode, forming an organic active pattern on the gate insulating layer using a rear exposing process, and forming source and drain electrodes on the organic active pattern.

In another aspect, a method for fabricating a liquid crystal display device includes forming a gate electrode on a first substrate, forming a gate insulating layer on the first substrate including the gate electrode, forming an organic active pattern on the gate insulating layer using a rear exposing process, forming source and drain electrodes on the organic active pattern, attaching the first substrate to a second substrate with a predetermined space therebetween, and forming a liquid crystal layer between the first and second substrates.

In yet another aspect, an organic thin film transistor includes a gate electrode on a first substrate, a gate insulating layer on the first substrate covering the gate electrode, an organic active layer on the gate insulating layer corresponding to the gate electrode, an inorganic pattern on the organic active layer, and source and drain electrodes on the inorganic pattern, the source and drain electrodes electrically connected to the organic active layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
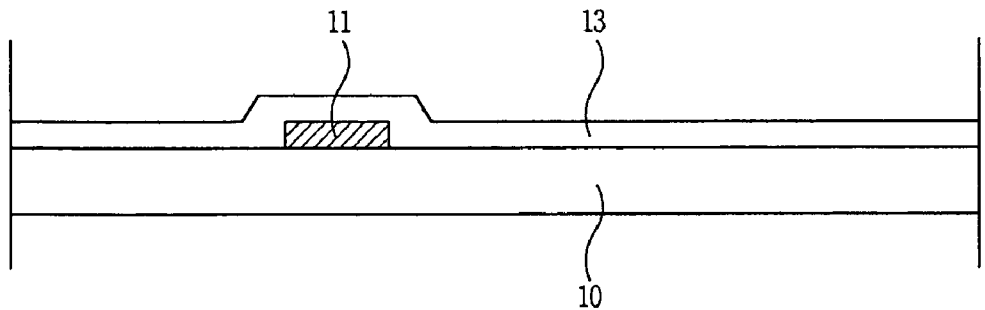
FIGS. 1A to 1E are cross-sectional views showing a method for fabricating an organic thin film transistor (OTFT) in accordance to the related art.
Figure 1B:
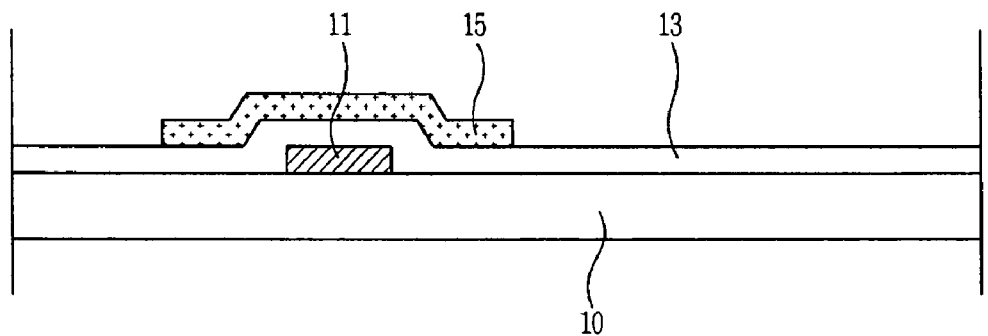
Figure 1C:
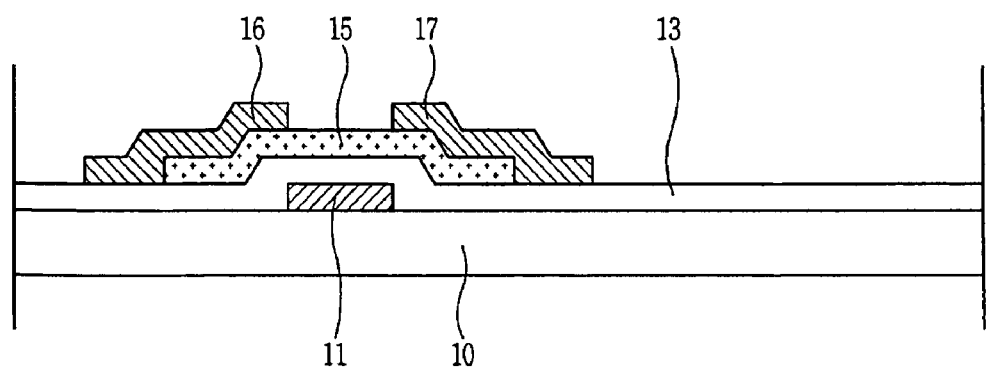
Figure 1D:
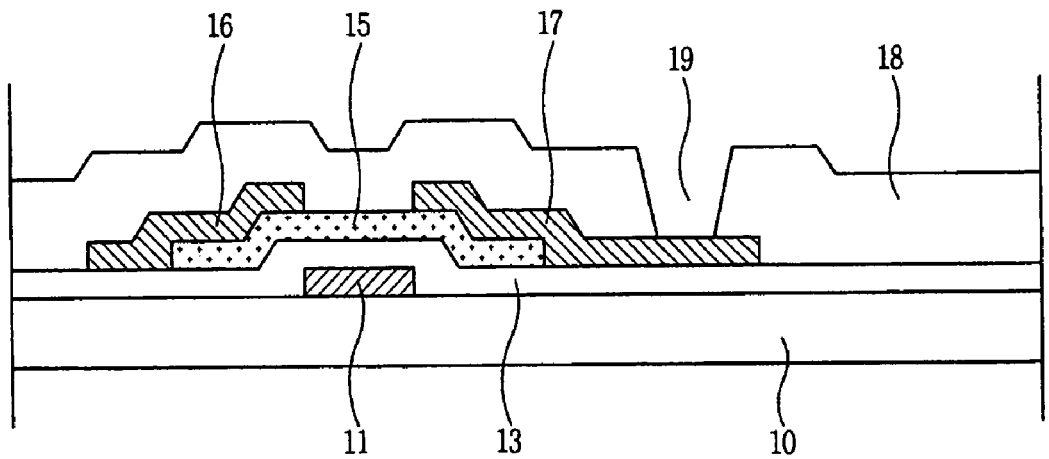
Figure 1E:
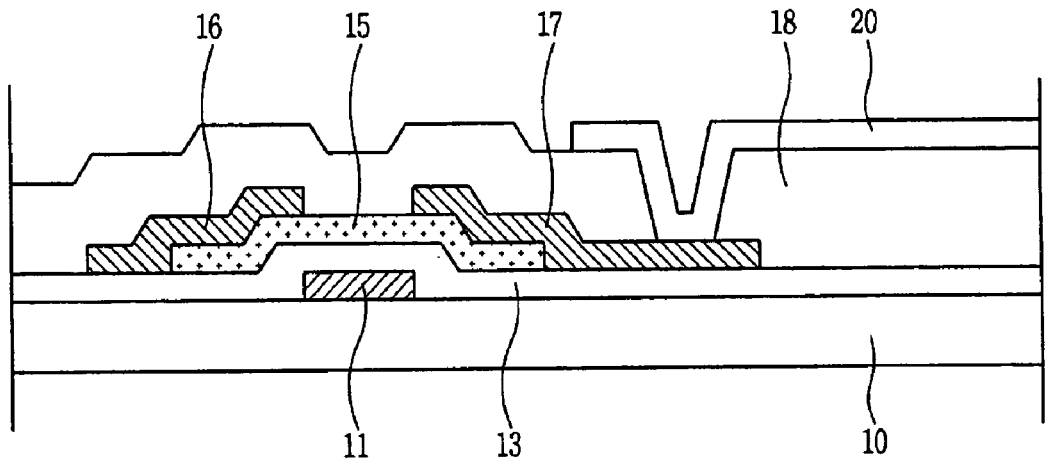
Figure 2A:
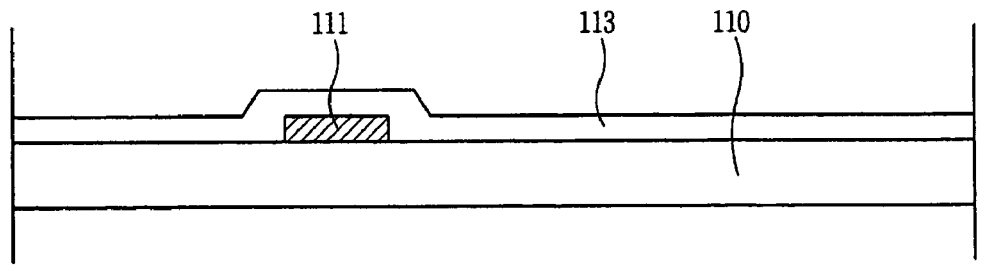
FIGS. 2A to 2E are cross-sectional views showing a method for fabricating an OTFT in accordance to an embodiment of the present invention.
Figure 2B:
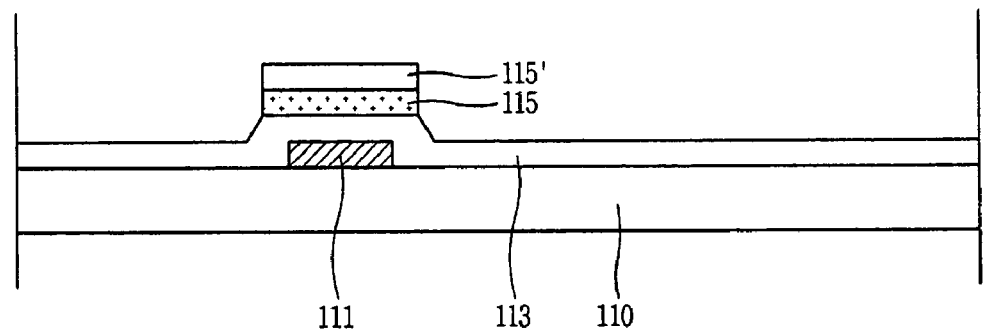
Figure 2C:
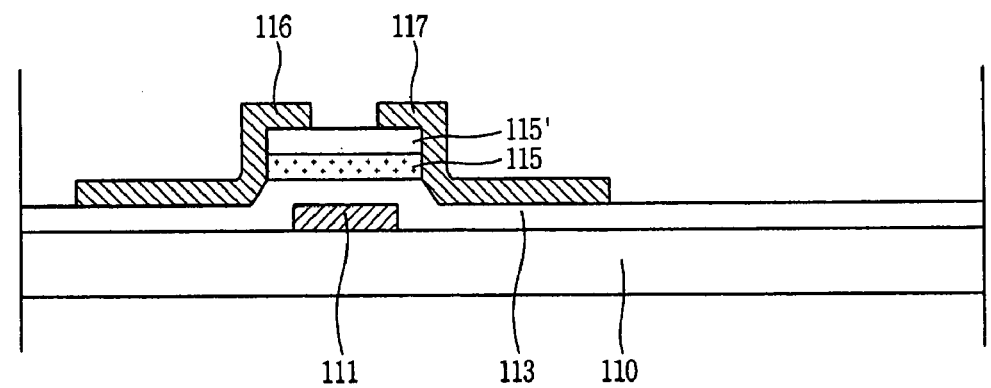
Figure 2D:
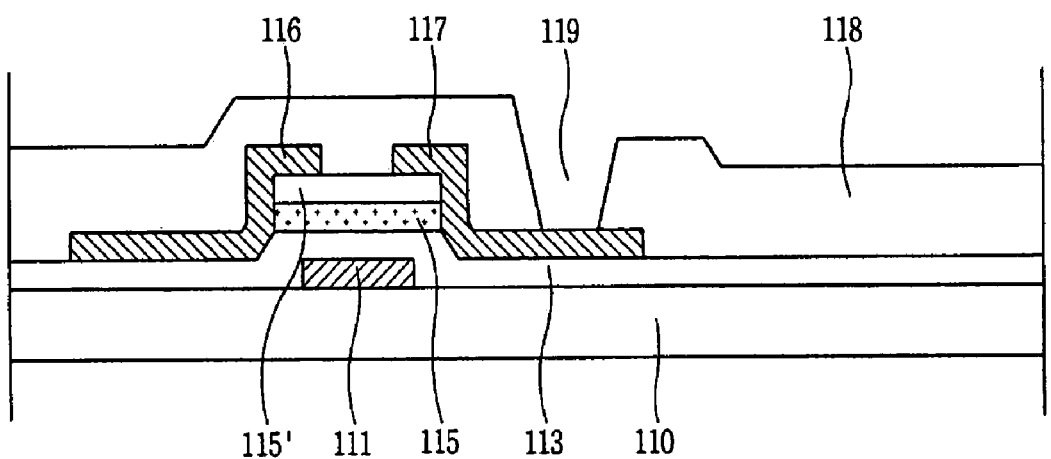
Figure 2E:
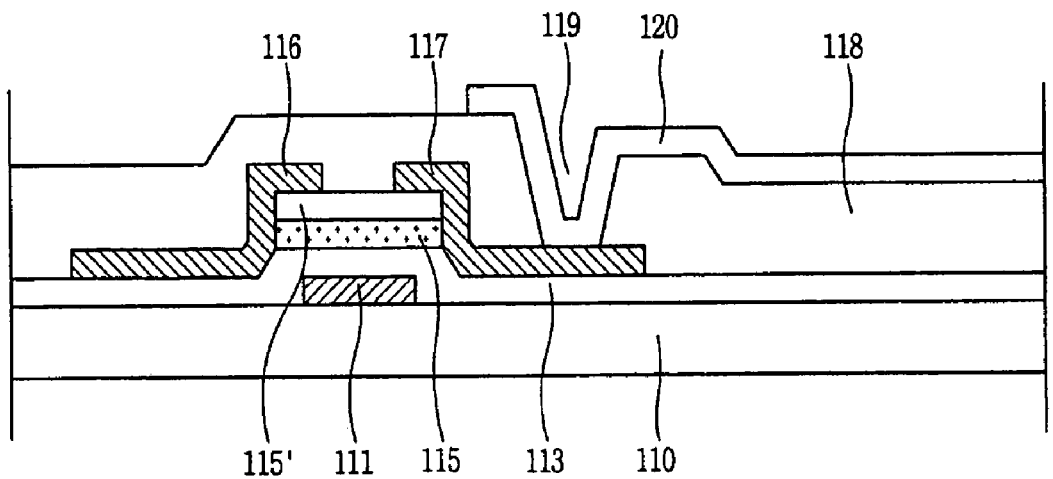
Figure 3A:
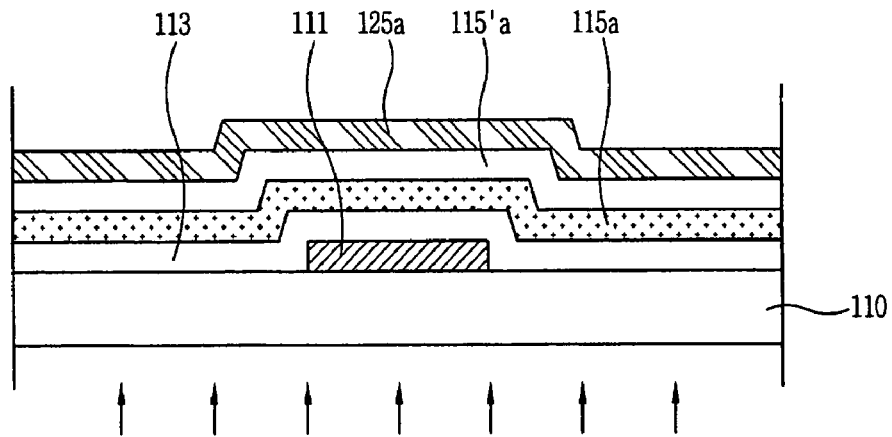
FIGS. 3A to 3C are cross-sectional views showing a method for forming the active layer of the OTFT shown in FIG. 2B.
Figure 3B:
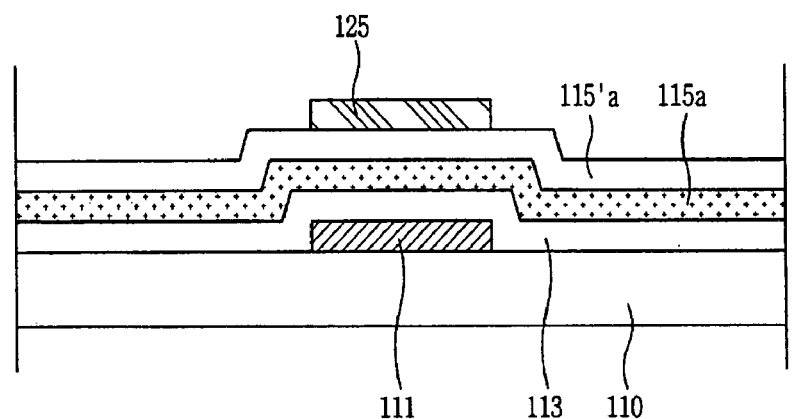
Figure 3C:
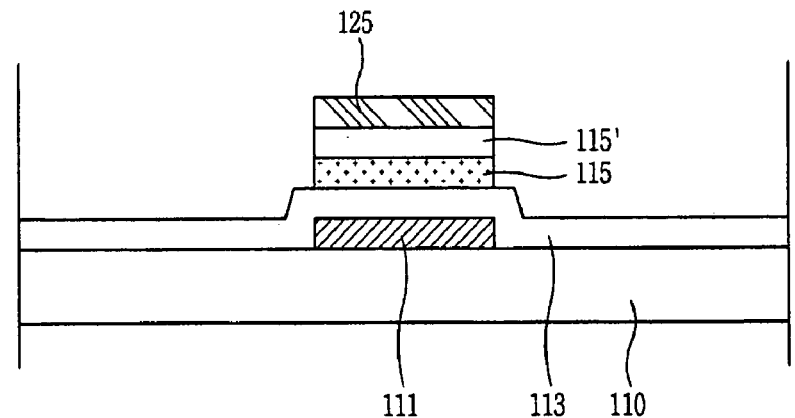

FIGS. 2A to 2E are cross-sectional views showing a method for fabricating an OTFT in accordance to an embodiment of the present invention, and FIGS. 3A to 3C are cross-sectional views showing a method for forming the active layer of the OTFT shown in FIG. 2B. As shown in FIG. 2A, a method for fabricating an OTFT includes preparing a first transparent substrate 110. In particular, a first conductive material is deposited and patterned to form a gate electrode 111.

The first conductive material may include one of Cu, Ti, Cr, Al, Mo, Ta and Al alloy, and the first conductive material may be patterned using a photolithography process. The photolithography process may include a photoresist film coating process for coating a photoresist film on an etching object layer on which a pattern is to be formed, an exposing process for aligning a mask on the photoresist film and irradiating light through the mask, a developing process for forming a photoresist pattern on the etching object layer by removing the irradiated portions of the photoresist film using a developer, an etching process for forming a desired pattern by etching the etching object layer by using the photoresist pattern as a mask, and a striping process for removing the photoresist pattern remaining on the pattern. For example, the first conductive material may be the etching object layer, and the gate electrode 111 may be patterned as the first conductive material is etched.

Alternatively, the first conductive material may include Ag paste, and the first conductive material may be printed on the first substrate 110 to form the gate electrode 111. Since the printing process may be performed at an atmospheric pressure, which is much simpler than the photolithography process, production efficiency is thereby improved.

After forming the gate electrode 111 on the first substrate 110, an inorganic material is formed on the entire surface of the first substrate 110 including the gate electrode 111 to form a gate insulating layer 113. The inorganic material may include one of silicon nitride (SiNx) film and a silicon oxide (SiOx) film. Alternatively, instead of the inorganic material, an organic material may be formed on the entire surface of the first substrate 110. The organic material may include one of poly-vinyl-pyrrolidone (PVP) and poly-methly-methAcrylate (PMMA), and the organic material may be coated on the first substrate 110 to form the gate insulating layer 113. Since a coating process may be performed at the atmospheric pressure without using vacuum equipment, production efficiency is thereby improved.

In FIG. 2B, an organic film and an inorganic film are sequentially formed on the gate insulating layer 113 and then patterned to form an active layer 115 and an inorganic pattern 115'. For example, the organic film and the inorganic film may be patterned using a rear exposing process to respectively form the active layer 115 and the inorganic pattern 115'. In particular, after the organic film and the inorganic film are formed, a photoresist film may be coated on the inorganic film. Then, light is irradiated through the rear surface of the first substrate 110 to form a photoresist pattern. That is, the gate electrode 111, the gate insulating layer 113, the organic film, the inorganic film and the photoresist film are formed on a first surface of the first substrate 110, and light is irradiated onto a second surface of the first substrate 110 that is opposite to the first surface to form a photoresist pattern. Then, the inorganic film and the organic film are etched by using the photoresist pattern as a mask to form the active layer 115 and the inorganic pattern 115'.

As shown in FIG. 3A, the organic film 115a and the inorganic film 115'a are sequentially stacked on the gate insulating layer 113 on the first surface of the first substrate 110. The organic film 115a may include a low-molecule organic material, such as pentacene, which may be formed on the first substrate 110 by a deposition method, or an organic material such as polyacrylamine (PAA), which may be formed on the first substrate 110 by a coating method.

In order to pattern the organic film 115a, the photoresist film 125a needs to be coated thereon. However, if the photoresist film 125a is directly coated on the organic film 115a, moisture contained in the photoresist film 125a can infiltrate into the organic film 115a. In particular, if the organic film 115a is exposed to moisture, its electrical characteristics are degraded. Thus, the inorganic film 115'a is formed on the organic film 115a for protecting the organic film 115a from moisture, thereby improving product reliability. The inorganic film 115'a may include one of inorganic materials, such as SiNx, SiOx or indium oxide. Then, a photoresist film 125a is stacked on the inorganic film 115'a.

Thereafter, light, shown as upward arrows, is irradiated through the second surface of the first substrate 110 to expose the photoresist film 125a. In particular, since the gate electrode 111 blocks light, thereby functioning as a mask, light is not irradiated to the portion of the photoresist film 125a corresponding to the gate electrode 111.

As shown in FIG. 3B, a photoresist pattern 125 is formed at an upper side of the gate electrode 111. In particular, after the photoresist film 125a is partially irradiated by light (as shown in FIG. 3A), a developer is used to remove the irradiated portions of the photoresist film 125a, thereby forming the photoresist pattern 125.

As shown in FIG. 3C, the active layer 115 and the inorganic pattern 115' are subsequently formed. In particular, the organic film 115a and the inorganic film 115'a (shown in FIG. 3B) are etched by using the photoresist pattern 125 as a mask. Although not shown, the photoresist pattern 125 then is removed using a strip process. Further, the inorganic pattern 115' also may be removed using a dry etching process or may be remained on the active layer 115.

Referring back to FIG. 2C, after the active layer 115 is formed, a second conductive material is deposited on the entire surface of the first substrate 110 including the active layer 115, and is patterned to form a source electrode 116 and a drain electrode 117 which contact the active layer 115. The second conductive material may include one of Cu, Mo, Ta, Al, Cr, Ti and Al alloy, and may be patterned using a photolithography process to form the source and drain electrodes 116 and 117. In particular, the second conductive material may be the same material as the first conductive material. Alternatively, the second conductive material may include a conductive polymer material and may be coated or printed on the first substrate 110 to form the source and drain electrodes 116 and 117. Since the coating or printing process may be performed at an atmospheric pressure, which is much simpler than the photolithography process, production efficiency is thereby improved.

In FIG. 2D, a passivation film 118 is formed on the entire surface of the first substrate 110 including the source and drain electrodes 116 and 117. The passivation film 118 may include an inorganic material, such as SiNx or SiOx, or an organic material, such as BCB or acryl. Further, a portion of the passivation film 118 is removed to form a contact hole 119 exposing a portion of the drain electrode 117. The contact hole 119 may be formed using the photolithography process. In particular, when the organic material is employed to form the passivation film 118, the process may be performed at the atmospheric pressure, which is simpler than when the inorganic material is employed, production efficiency is thus improved.

In FIG. 2E, a pixel electrode 120 is formed on the first substrate 110 including the passivation film 118 and the contact hole 119. In particular, the pixel electrode 120 is formed to electrically connect to the drain electrode 117 through the contact hole 119. The pixel electrode 120 may include a transparent conductive material. The transparent conductive material may be formed on the first substrate 110 and patterned using the photolithography process. Further, the transparent conductive material may include indium tin oxide (ITO) or indium zinc oxide (IZO). Alternatively, a polymer organic material, such as poly elyene dioxty thiospnene (PEDOT), may be employed to form the pixel electrode 120, which may be more advantageous since its related process may be performed at the atmospheric pressure.

Although not shown, the first substrate 110 then may be attached to a second substrate having a color filter and a common electrode, and a liquid crystal layer is formed between the first substrate 110 and the second substrate to thereby form an LCD device.

Figure 4:
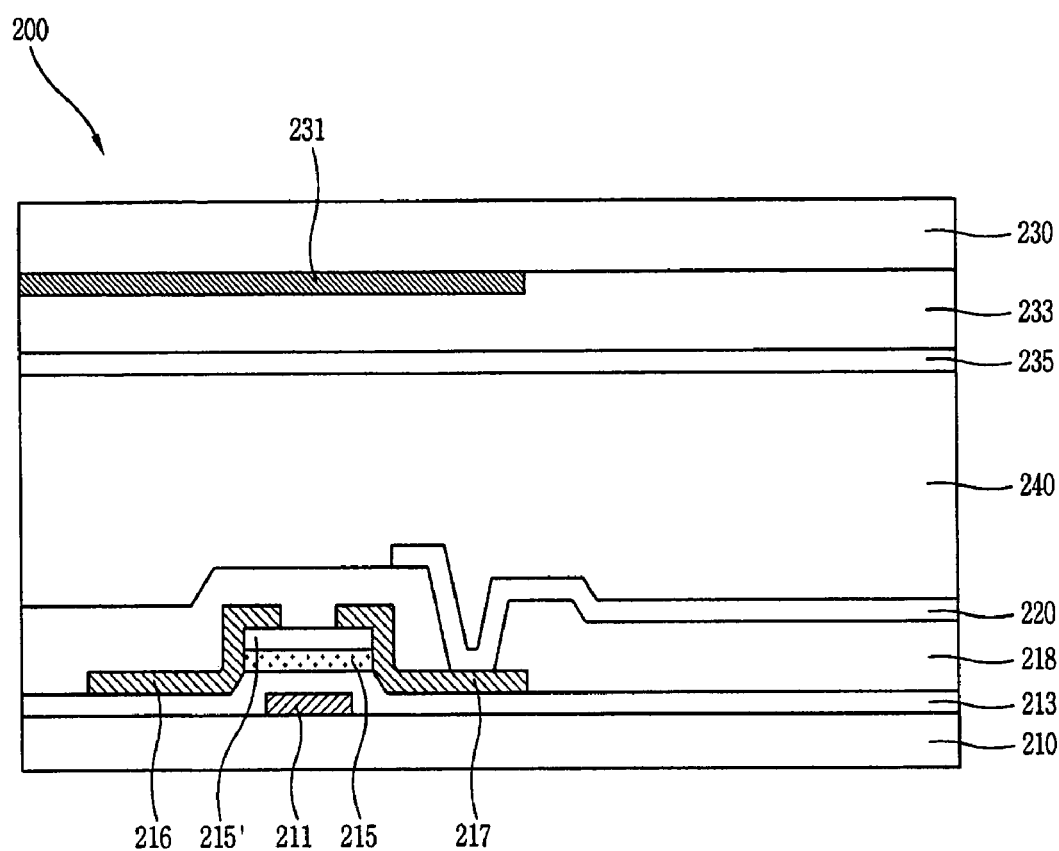
FIG. 4 is a cross-sectional view showing a liquid crystal display (LCD) device formed using the process of FIGS. 2A to 2E.

FIG. 4 is a cross-sectional view showing an LCD device formed using the process of FIGS. 2A to 2E. In FIG. 4, an LCD device 200 includes a first substrate 210 and a second substrate 230. In particular, the first substrate 210 includes an OTFT and a pixel electrode 220. The OTFT including a gate electrode 211, a gate insulating layer 213, an active layer 215, an inorganic pattern 215', a source electrode 216, a drain electrode 217, and a passivation layer 218 may be formed by the method shown in FIGS. 2A and 2E.

Further, the second substrate 230 includes a black matrix 231, a color filter 233 and a common electrode 235 sequentially formed thereon. Then, the first and second substrates 210 and 230 are attached to each other with a space therebetween, and a liquid crystal layer 240 is formed between the first and second substrates 210 and 230.

Although a method for forming the black matrix 231, the color filter 233 and the common electrode 235 formed on the second substrate 230 is not mentioned in detail, the black matrix 231 may be formed of an organic material or a metal material, and the common electrode 235 may be formed of a conductive material, such as ITO or IZO, or a polymer conductive material, such as PEDOT like the pixel electrode 220.

Alternatively, although not shown, both the common electrode 235 and the pixel electrode 220 may be formed on the first substrate 210. Formation of the common electrode 235 and the pixel electrode 220 on the same substrate, e.g., the first substrate 210, improves viewing angle characteristics according to horizontal driving of liquid crystal molecules of the liquid crystal layer 240.

Accordingly, the OTFT according to an embodiment of the present invention includes an active layer formed using the rear exposing process, thereby omitting the shadow mask process. In addition, the active layer is more accurately formed in comparison with the related art. For example, in the related art, the organic active pattern is formed by using a shadow mask. However, the shadow mask does not provide fine pattern in terms of its characteristics and may be easily misaligned with the substrate, such that the active pattern is not accurately formed. In contrast, in an embodiment of the present invention, an inorganic film is formed on the organic film, a back exposing process, which provides fine pattern, is employed, and the gate electrode selectively blocks light to define a photoresist pattern. As a result, the active layer is more accurately formed.

Figure 5A:
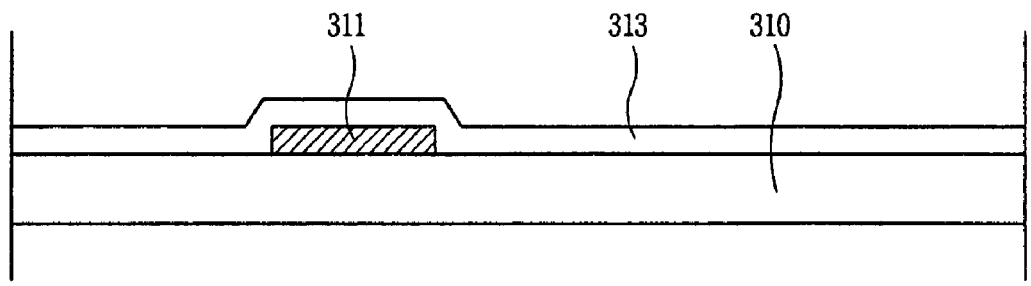
FIGS. 5A to 5E are cross-sectional view showing a method for fabricating an OTFT in accordance to another embodiment of the present invention.
Figure 5B:
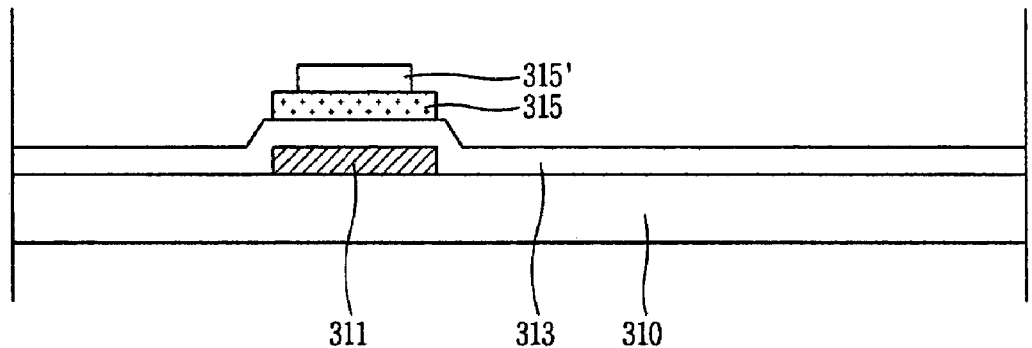

FIGS. 5A to 5E are cross-sectional view showing a method for fabricating an OTFT in accordance with another embodiment of the present invention, and FIGS. 6A to 6E are cross-sectional views showing a method for forming the active layer of the OTFT shown in FIG. 5B. As shown in FIG. 5A, a method for fabricating an OTFT includes preparing a first transparent substrate 310. In particular, a first conductive material is deposited and patterned to form a gate electrode 311.

The first conductive material may include one of Cu, Ti, Cr, Al, Mo, Ta and Al alloy, and the first conductive material may be patterned using a photolithography process. The photolithography process may include a photoresist film coating process for coating a photoresist film on an etching object layer on which a pattern is to be formed, an exposing process for aligning a mask on the photoresist film and irradiating light through the mask, a developing process for forming a photoresist pattern on the etching object layer by removing the irradiated portions of the photoresist film using a developer, an etching process for forming a desired pattern by etching the etching object layer by using the photoresist pattern as a mask, and a striping process for removing the photoresist pattern remaining on the pattern. For example, the first conductive material may be the etching object layer, and the gate electrode 311 may be patterned as the first conductive material is etched.

Alternatively, the first conductive material may include Ag paste, and the first conductive material may be printed on the first substrate 310 to form the gate electrode 311. Since the printing process may be performed at an atmospheric pressure, which is much simpler than the photolithography process, production efficiency is thereby improved.

After forming the gate electrode 311 on the first substrate 310, an inorganic material is formed on the entire surface of the first substrate 310 including the gate electrode 311 to form a gate insulating layer 313. The inorganic material may include one of silicon nitride (SiNx) film and a silicon oxide (SiOx) film. Alternatively, instead of the inorganic material, an organic material may be formed on the entire surface of the first substrate 110. The organic material may include one of poly-vinyl-pyrrolidone (PVP) and poly-methly-methAcrylate (PMMA), and the organic material may be coated on the first substrate 310 to form the gate insulating layer 313. Since a coating process may be performed at the atmospheric pressure without using vacuum equipment, production efficiency is thereby improved.

In FIG. 5B, an organic film and an inorganic film are sequentially formed on the gate insulating layer 313 and then patterned to form an active layer 315 and an inorganic pattern 315'. For example, the organic film and the inorganic film may be patterned using a rear exposing process to respectively form the active layer 315 and the inorganic pattern 315'. In particular, after the organic film and the inorganic film are formed, a photoresist film may be coated on the inorganic film. Then, light is irradiated through the rear surface of the first substrate 310 to form a photoresist pattern. That is, the gate electrode 311, the gate insulating layer 313, the organic film, the inorganic film and the photoresist film are formed on a first surface of the first substrate 310, and light is irradiated onto a second surface of the first substrate 310 that is opposite to the first surface to form a photoresist pattern. Then, the inorganic film and the organic film are etched by using the photoresist pattern as a mask to form the active layer 315 and the inorganic pattern 315'.

Figure 6A:
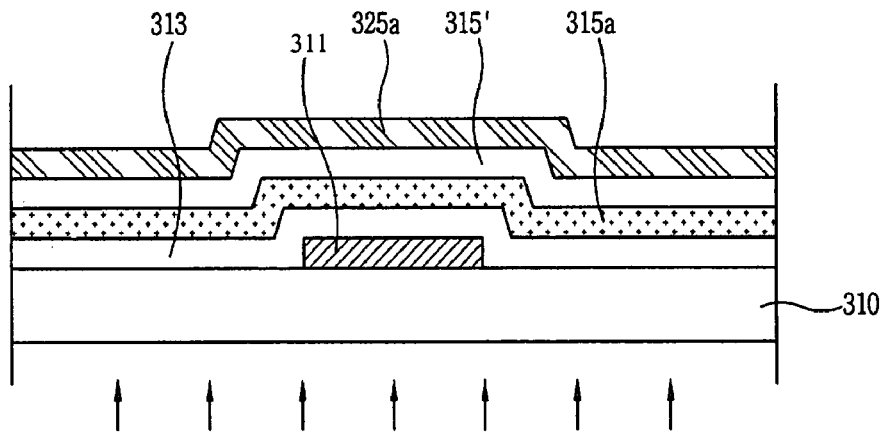
FIGS. 6A to 6E are cross-sectional views showing a method for forming the active layer of the OTFT shown in FIG. 5B.

As shown in FIG. 6A, the organic film 315a and the inorganic film 315'a are sequentially stacked on the gate insulating layer 313 on the first surface of the first substrate 310. The organic film 315a may include a low-molecule organic material, such as pentacene, which may be formed on the first substrate 310 by a deposition method, or an organic material such as polyacrylamine (PAA), which may be formed on the first substrate 310 by a coating method.

In order to pattern the organic film 315a, the photoresist film 325a needs to be coated thereon. However, if the photoresist film 325a is directly coated on the organic film 315a, moisture contained in the photoresist film 325a can infiltrate into the organic film 315a. In particular, if the organic film 315a is exposed to moisture, its electrical characteristics are degraded. Thus, the inorganic film 315'a is formed on the organic film 315a for protecting the organic film 315a from moisture, thereby improving product reliability. The inorganic film 315'a may include one of inorganic materials, such as SiNx, SiOx or indium oxide. Then, a photoresist film 325a is stacked on the inorganic film 315'a.

Thereafter, light, shown as upward arrows, is irradiated through the second surface of the first substrate 310 to expose the photoresist film 325a. In particular, since the gate electrode 311 blocks light, thereby functioning as a mask, light is not irradiated to the portion of the photoresist film 325a corresponding to the gate electrode 311.

Figure 6B:
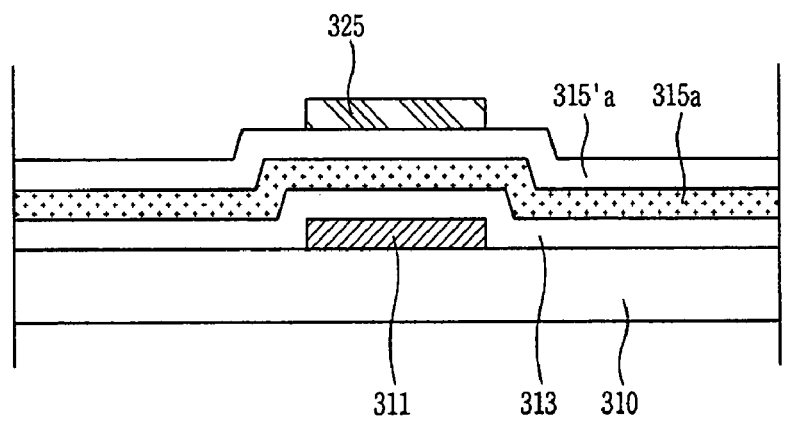

As shown in FIG. 6B, a first photoresist pattern 325 is formed at an upper side of the gate electrode 311. In particular, after the photoresist film 325a is partially irradiated by light (as shown in FIG. 6A), a developer is used to remove the irradiated portions of the photoresist film 325a, thereby forming the first photoresist pattern 325.

Figure 6C:
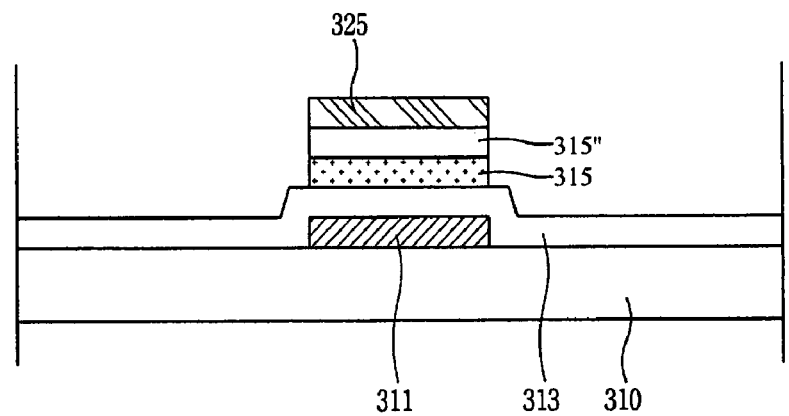

As shown in FIG. 6C, the active layer 315 and a first inorganic pattern 315" are subsequently formed. In particular, the organic film 315a and the inorganic film 315'a (shown in FIG. 6B) are etched by using the first photoresist pattern 325 as a mask.

Figure 6D:
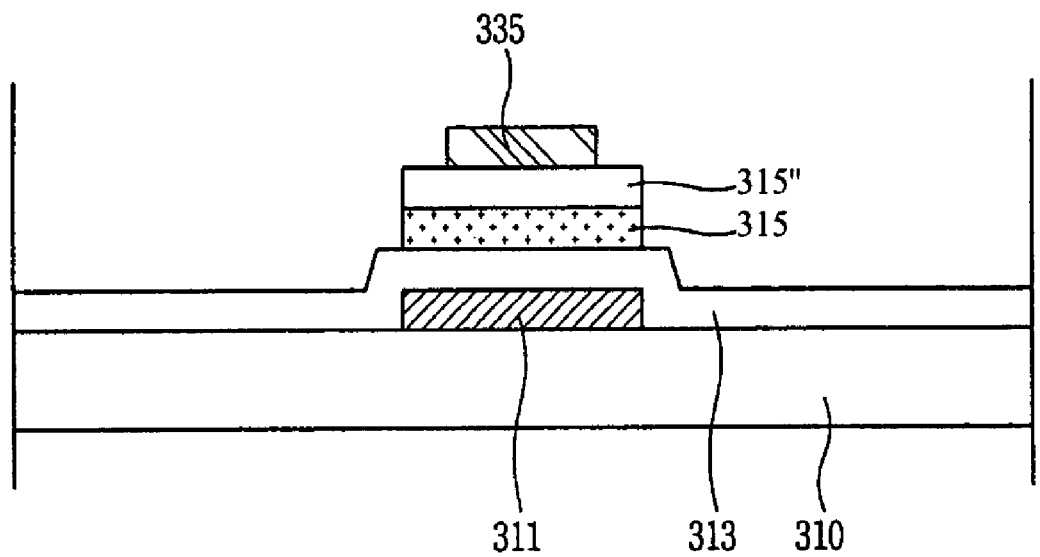

In FIG. 6D, a second photoresist pattern 335 is formed on the first substrate 310 including the active layer 315 and the first inorganic pattern 315". In particular, the first photoresist pattern 325 (shown in FIG. 6C) is partially removed using an ashing process after the active layer 315 and the first inorganic pattern 315" are formed. For example, the ashing process may burn out the photoresist material to expose sides of the first inorganic pattern 315". As the surface of the first photoresist pattern 325 is burnt out, the side and the surface of the first photoresist pattern 325 are removed, and as the side is removed, a certain portion of the first inorganic pattern 315" is exposed and its thickness is reduced.

Figure 6E:
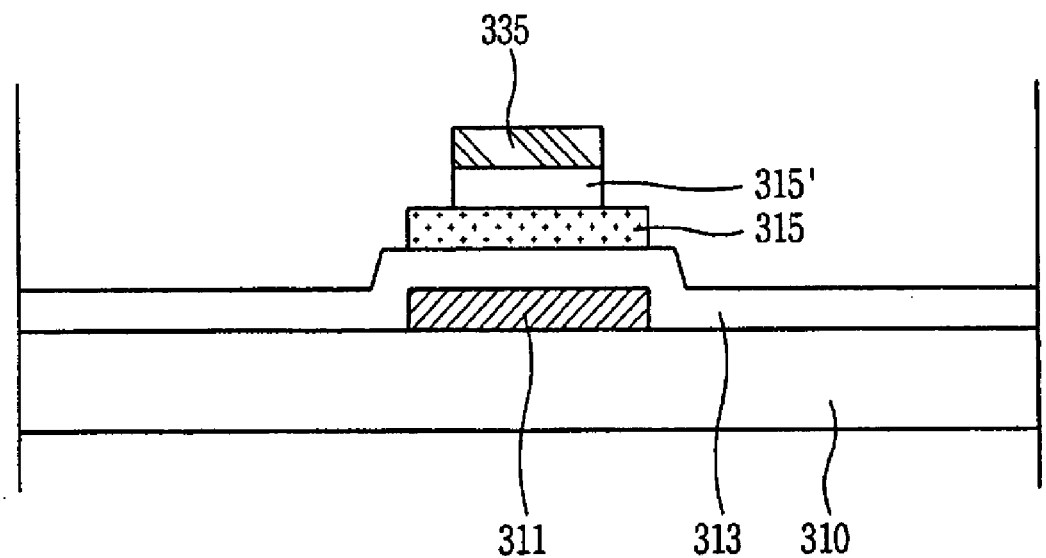

As shown in FIG. 6E, the inorganic pattern 315' is subsequently formed. In particular, exposed portions of the first inorganic pattern 315" (shown in FIG. 6D) are etched by using the second photoresist pattern 335 as a mask. As a result, portions of the upper surface and sides of the active layer 315 are exposed. Further, although not shown, the second photoresist pattern 335 then is removed using a strip process.

Figure 5C:
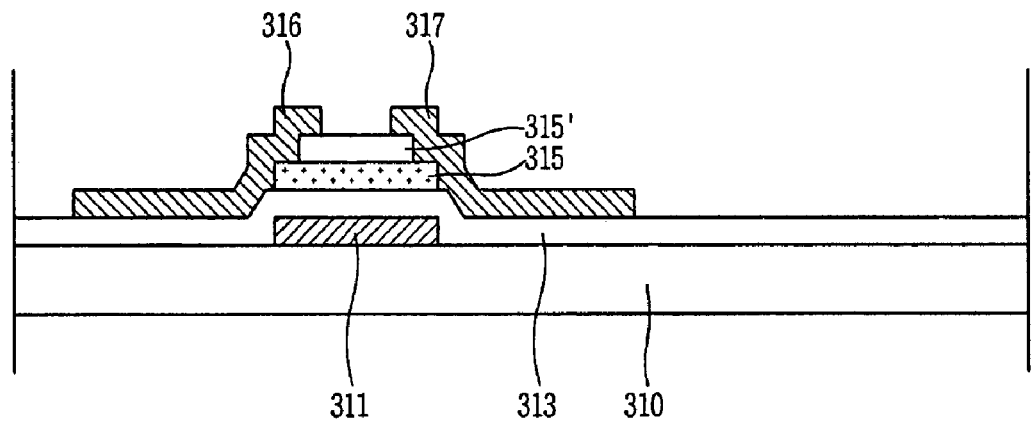

Referring-back to FIG. 5C, after the active layer 315 is formed, a second conductive material is deposited on the entire surface of the first substrate 310 including the active layer 315, and is patterned to form a source electrode 316 and a drain electrode 317 which contact the active layer 315. In particular, since portions of the upper surface of the active layer 315 are exposed, the contact surface between the active layer 315 and the source/drain electrode 316 or 317 increases, thereby improving electrical characteristics of the resultant OTFT.

The second conductive material may include one of Cu, Mo, Ta, Al, Cr, Ti and Al alloy, and may be patterned using a photolithography process to form the source and drain electrodes 316 and 317. In particular, the second conductive material may be the same material as the first conductive material. Alternatively, the second conductive material may include a conductive polymer material and may be coated or printed on the first substrate 310 to form the source and drain electrodes 316 and 317. Since the coating or printing process may be performed at an atmospheric pressure, which is much simpler than the photolithography process, production efficiency is thereby improved.

Figure 5D:
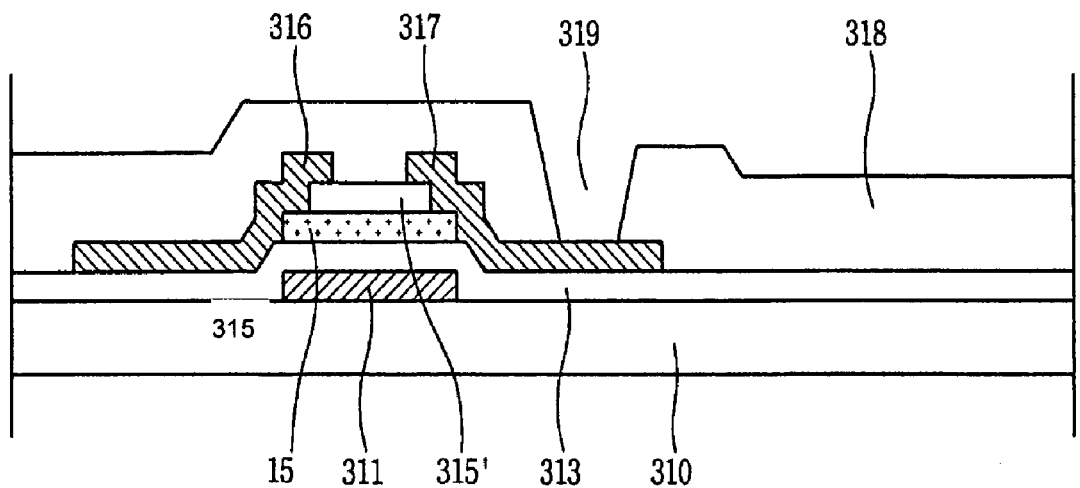

In FIG. 5D, a passivation film 318 is formed on the entire surface of the first substrate 310 including the source and drain electrodes 316 and 317. The passivation film 318 may include an inorganic material, such as SiNx or SiOx, or an organic material, such as BCB or acryl. Further, a portion of the passivation film 318 is removed to form a contact hole 319 exposing a portion of the drain electrode 317. The contact hole 319 may be formed using the photolithography process. In particular, when the organic material is employed to form the passivation film 318, the process may be performed at the atmospheric pressure, which is simpler than when the inorganic material is employed, production efficiency is thus improved.

Figure 5E:
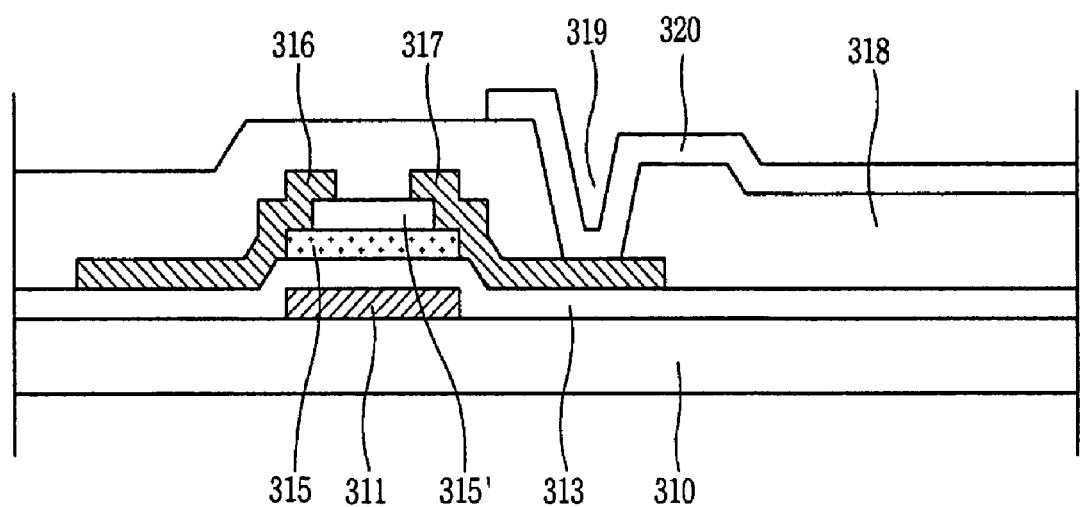

In FIG. 5E, a pixel electrode 320 is formed on the first substrate 310 including the passivation film 318 and the contact hole 319. In particular, the pixel electrode 320 is formed to electrically connect to the drain electrode 317 through the contact hole 319. The pixel electrode 320 may include a transparent conductive material. The transparent conductive material may be formed on the first substrate 310 and patterned using the photolithography process. Further, the transparent conductive material may include indium tin oxide (ITO) or indium zinc oxide (IZO). Alternatively, a polymer organic material, such as poly elyene dioxty thiospnene (PEDOT), may be employed to form the pixel electrode 320, which may be more advantageous since its related process may be performed at the atmospheric pressure.

Although not shown, the first substrate 310 then may be attached to a second substrate having a color filter and a common electrode, and a liquid crystal layer is formed between the first substrate 310 and the second substrate to thereby form an LCD device.

Accordingly, according to an embodiment of the present invention, the source and drain electrodes contact the exposed portions of the upper surface of the active layer as well as the sides of the active layer. As a result, the contact area between the active layer 315 and the source and drain electrodes 316 and 317 increases, because sides of the inorganic pattern 315' are removed to expose portions of the upper surface of the active layer.

Figure 7:
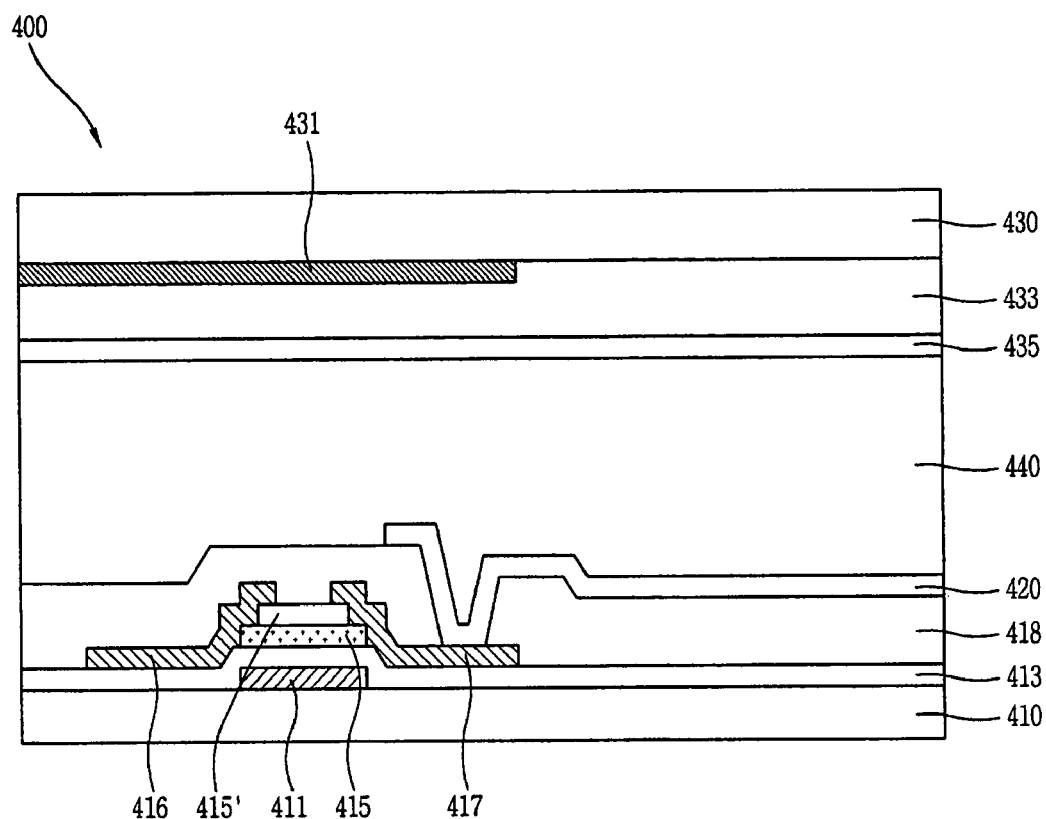
FIG. 7 is a cross-sectional view showing an LCD device formed using the process of FIGS. 5A to 5E.

FIG. 7 is a cross-sectional view showing an LCD device formed using the process of FIGS. 5A to 5E. In FIG. 7, an LCD device 400 includes a first substrate 410 and a second substrate 430. In particular, the first substrate 410 includes an OTFT and a pixel electrode 420. The OTFT including a gate electrode 411, a gate insulating layer 413, an active layer 415, an inorganic pattern 415', a source electrode 416, a drain electrode 417, and a passivation layer 418 may be formed by the method shown in FIGS. 5A and 5E.

Further, the second substrate 430 includes a black matrix 431, a color filter 433 and a common electrode 435 sequentially formed thereon. Then, the first and second substrates 410 and 430 are attached to each other with a space therebetween, and a liquid crystal layer 440 is formed between the first and second substrates 410 and 430.

Although a method for forming the black matrix 431, the color filter 433 and the common electrode 435 formed on the second substrate 430 is not mentioned in detail, the black matrix 431 may be formed of an organic material or a metal material, and the common electrode 435 may be formed of a conductive material, such as ITO or IZO, or a polymer conductive material, such as PEDOT like the pixel electrode 420.

Alternatively, although not shown, both the common electrode 435 and the pixel electrode 420 may be formed on the first substrate 410. Formation of the common electrode 435 and the pixel electrode 420 on the same substrate, e.g., the first substrate 410, improves viewing angle characteristics according to horizontal driving of liquid crystal molecules of the liquid crystal layer 440.

Accordingly, the method for fabricating an OTFT according to an embodiment of the present invention does not require a shadow mask to form the active layer of the OTFT, thereby simplifying the fabrication process. In particular, in the method for fabricating an OTFT according to an embodiment of the present invention, instead of a shadow mask, an inorganic film is formed on an organic film, a photoresist film is coated on the inorganic film, and a photoresist pattern is formed at the upper portion of a gate electrode using a rear exposing process. Then, the organic and inorganic films are etched by using the photoresist pattern as a mask to accurately form an active layer.

In addition, in the method for fabricating an OTFT according to an embodiment of the present invention, side portions of the inorganic film are etched to expose portions of the upper surface of the active layer prior to forming source and drain electrodes. As a result, the contact area between the active layer and the source and drain electrodes increases, thereby enhancing the characteristics of the OTFT.

Further, because the active pattern is formed using the rear exposing process, the number of masks used in the fabrication process is reduced. Furthermore, since a shadow mask generally is costly, the method for fabricating an OTFT according to an embodiment of the present invention also reduces fabrication costs and increases productivity.

Moreover, in the method for fabricating an OTFT according to an embodiment of the present invention, the gate electrode, the source electrode, the drain electrode or the passivation film may be formed using a coating or printing method at the atmospheric pressure by using an organic material or paste without using deposition equipment, thereby further improving production efficiency.

Although not shown, the method for fabricating a thin film transistor according to an embodiment of the present invention may be employed to fabricate any device utilizing a TFT, in addition to a LCD device.

It will be apparent to those skilled in the art that various modifications and variations can be made in the method for fabricating organic thin film transistor and method for fabricating liquid crystal display device using the same of the present invention without departing from the spirit or scope of the invention. Thus, it is intended that the present invention covers the modifications and variations of this invention provided they come within the scope of the appended claims and their equivalents.

What is claimed is:

1. A method for fabricating an organic thin film transistor comprising:
    forming a gate electrode on a substrate;
    forming a gate insulating layer on the substrate including the gate electrode;
    forming an organic film and an inorganic film on the gate insulating layer;
    coating a first photoresist film on the inorganic film;
    exposing the first photoresist film by irradiating light through a rear surface of the substrate;
    developing the exposed first photoresist film to form a first photoresist pattern at a region corresponding to the gate electrode; and etching the organic film and the inorganic film by using the first photoresist pattern as a first mask to form an organic active pattern including a thin film transistor channel;

ashing the first photoresist pattern to form a second photoresist pattern having a width smaller than that of the first photoreist pattern;

etching a part of the etched inorganic film using the ashed second photoresist pattern so that the area of upper surface of the inorganic film is smaller than that of the etched organic active pattern to expose a part of upper surface of the etched organic active pattern at the both end sides of the inorganic film;

forming source and drain electrodes on the inorganic film and the exposed part of the organic active pattern;

forming a passivation film on the entire surface of the substrate including the source and drain electrodes;

forming a contact hole in the passivation film, the contact hole exposing a portion of the drain electrode; and forming a pixel electrode on the passivation film, wherein the source and drain electrodes are respectively formed of a single layer made of an opaque metal selected from the group consisting of Cu, Mo, Ta, Al, Cr, Ti, Al alloy, the opaque metal being contacted directly with the side surfaces of organic active pattern and the exposed part of the organic active pattern and the pixel electrode is electrically connected to the opaque metal to be directly contacted with the side surface of the organic active pattern through the contact hole.

2. The method of claim 1, wherein a stacking of the organic film includes depositing one of pentacene and polyacrylamine (PAA) on the gate insulating layer.

3. The method of claim 1, wherein a stacking of the inorganic film includes depositing one of silicon nitride (SiNx), silicon oxide (SiOx), and indium oxide (InOx) on the organic film.

4. The method of claim 1, wherein etching a part of the inorganic film comprises:
   removing a portion of the first photoresist pattern to form a second photoresist pattern, the second photoresist pattern exposing portions of the etched inorganic film; and
   etching the exposed portions of the etched inorganic film using the second photoresist pattern as a mask.

5. The method of claim 1, wherein forming the gate electrode includes:
   depositing a metal material; and
   patterning the metal material using a photolithography process.

6. The method of claim 1, wherein forming the gate electrode includes printing Ag past on the substrate.

7. The method of claim 1, wherein forming the gate insulating layer includes coating an organic material on the substrate.

8. The method of claim 7, wherein the organic material of the gate insulating layer includes one of polyvinylPyrrolidone (PVP) and polymethylmethacrylate (PMMA).

9. The method of claim 1, wherein forming the source and drain electrodes includes printing or coating a conductive polymer on the organic active pattern.

10. The method of claim 1, wherein the passivation film includes an organic material.

11. The method of claim 10, wherein the organic material of the passivation film includes one of acryl and benzocyclobutene (BCB).

12. The method of claim 1, wherein the pixel electrode includes an organic material.

13. The method of claim 12, wherein the organic material of the pixel electrode includes polyelyene dioxy thiospnene (PEDOT).

14. A method of fabricating a liquid crystal display device comprising:
   forming a gate electrode on a first substrate;
   forming a gate insulating layer on the first substrate including the gate electrode;
   forming an organic film and an inorganic film on the gate insulating layer;
   coating a first photoresist film on the inorganic film;
   exposing the first photoresist film by irradiating light through a rear surface of the first substrate;
   developing the exposed first photoresist film to form a first photoresist pattern at a region corresponding to the gate electrode;
   etching the organic film and the inorganic film by using the first photoresist pattern as a mask to form an organic active pattern including a thin film transistor channel;
   ashing the first photoresist pattern to form a second photoresist pattern having a width smaller that that of the first photoresist pattern;
   etching a part of the etched inorganic film using the ashed second photoresist pattern so that the area of upper surface of the inorganic film is smaller than that of the etched organic active pattern to expose a part of upper surface of the organic active pattern at the both end sides of the inorganic film;
   forming source and drain electrodes on the inorganic film and the exposed part of the organic active pattern;
   forming a passivation film on the entire surface of the substrate including the source and drain electrodes;
   forming a contact hole in the passivation film, the contact hole exposing a portion of the drain electrode; and
   forming a pixel electrode on the passivation film;
   attaching the first substrate to a second substrate with a space therebetween; and
   forming a liquid crystal layer in the space between the first and second substrates,
   wherein the source and drain electrodes are respectively formed of a single layer made of an opaque metal selected from the group consisting of Cu, Mo, Ta, Al, Cr, Ti, Al alloy, the opaque metal being contacted directly with the side surfaces of organic active pattern and the exposed part of the organic active pattern and the pixel electrode is electrically connected to the opaque metal to be directly contacted with the side surface of the organic active pattern through the contact hole.

15. The method of claim 12, wherein a stacking of the organic film includes depositing one of pentacene and polyacylamine (PAA) on the gate insulating layer.

16. The method of claim 12, wherein the etching a part of the inorganic film comprises:
   removing a portion of the first photoresist pattern to form a second photoresist pattern, the second photoresist pattern exposing portions of the etched inorganic film; and
   etching the exposed portions of the etched inorganic film using the second photoresist pattern as a mask.

17. The method of claim 12, further comprising:
   forming a black matrix on the second substrate;
   forming a color filter on the black matrix; and
   forming a common electrode on the color filter.

* * * * *